(12) United States Patent
Yamaguchi et al.

(10) Patent No.: US 11,569,098 B2
(45) Date of Patent: Jan. 31, 2023

(54) HEAT TREATMENT APPARATUS

(71) Applicant: Tokyo Electron Limited, Tokyo (JP)

(72) Inventors: Tatsuya Yamaguchi, Iwate (JP); Yasuaki Kikuchi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 771 days.

(21) Appl. No.: 16/398,547

(22) Filed: Apr. 30, 2019

(65) Prior Publication Data
US 2019/0341281 A1 Nov. 7, 2019

(30) Foreign Application Priority Data

May 2, 2018 (JP) .............................. JP2018-088819

(51) Int. Cl.
F24D 11/00 (2022.01)
H01L 21/67 (2006.01)
F26B 23/06 (2006.01)

(52) U.S. Cl.
CPC ........ H01L 21/67109 (2013.01); F26B 23/06 (2013.01)

(58) Field of Classification Search
CPC ............. F26B 23/06; H01L 21/67017; H01L 21/67103; H01L 21/67109; C23C 16/4401; C23C 16/4412; C23C 16/45578; C23C 16/45591; C23C 16/4584; C23C 16/46
USPC .................. 219/285, 390–393; 392/416–418
See application file for complete search history.

(56) References Cited

U.S. PATENT DOCUMENTS

| | | | | |
|---|---|---|---|---|
| 4,055,003 A | * | 10/1977 | Sack | F26B 13/104 34/632 |
| 5,616,264 A | * | 4/1997 | Nishi | C30B 25/10 219/494 |
| 2008/0205864 A1 | | 8/2008 | Kobayashi et al. | |
| 2008/0232787 A1 | | 9/2008 | Ichikawa et al. | |
| 2012/0186573 A1 | * | 7/2012 | Jdira | H01L 21/67109 126/58 |
| 2012/0329002 A1 | | 12/2012 | Kobayashi et al. | |
| 2014/0103024 A1 | * | 4/2014 | Kobayashi | H01L 21/67109 219/402 |

FOREIGN PATENT DOCUMENTS

| | | |
|---|---|---|
| JP | H07-58046 A | 3/1995 |
| JP | 2002-075890 A | 3/2002 |
| JP | 2004-071619 A | 3/2004 |
| JP | 2009-019762 A | 1/2009 |
| JP | 2012-039006 A | 2/2012 |
| JP | 2014-079990 A | 5/2014 |
| JP | 2014-082014 A | 5/2014 |
| KR | 10-2012-0014881 A | 2/2012 |
| KR | 10-2014-0049930 A | 4/2014 |

* cited by examiner

*Primary Examiner* — Sang Y Paik
(74) *Attorney, Agent, or Firm* — Venjuris, P.C.

(57) ABSTRACT

A heat treatment apparatus includes: a processing container extended in a vertical direction; and a heater provided to surround the processing container. The heater includes: a first insulator of a cylindrical shape that has a ceiling surface and an opening at a lower end; a heat generator provided along a circumferential direction on an inner circumferential side of the first insulating member; and a second insulator arranged along the circumferential direction of the first insulating member at a position adjacent to the heat generating elements.

20 Claims, 5 Drawing Sheets

HEAT TREATMENT APPARATUS

CROSS-REFERENCE TO RELATED APPLICATIONS

This application is based on and claims priority from Japanese Patent Application No. 2018-088819 filed on May 2, 2018 with the Japan Patent Office, the disclosure of which is incorporated herein in its entirety by reference.

TECHNICAL FIELD

The present disclosure relates to a heat treatment apparatus.

BACKGROUND

A batch type vertical heat treatment apparatus has been known in which a heat treatment is performed on a plurality of substrates at once. In the vertical heat treatment apparatus, a heater device configured to heat the substrates is provided on an outer circumferential side of a vertically extended processing container so as to surround the processing container. The heater device is formed by spirally winding a heater wire on an inner circumferential side of an insulating layer of a cylindrical shape (see, e.g., Japanese Patent Laid-Open Publication No. 2012-039006).

SUMMARY

A heat treatment apparatus according to an aspect of the present disclosure includes a processing container extended in a vertical direction; and a heater provided to surround the processing container. The heater includes a first insulator of a cylindrical shape that has a ceiling surface and an opening at a lower end, a heat generator provided along a circumferential direction on an inner circumferential side of the first insulating member, and a second insulator arranged along the circumferential direction of the first insulating member at a position adjacent to the heat generating elements.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
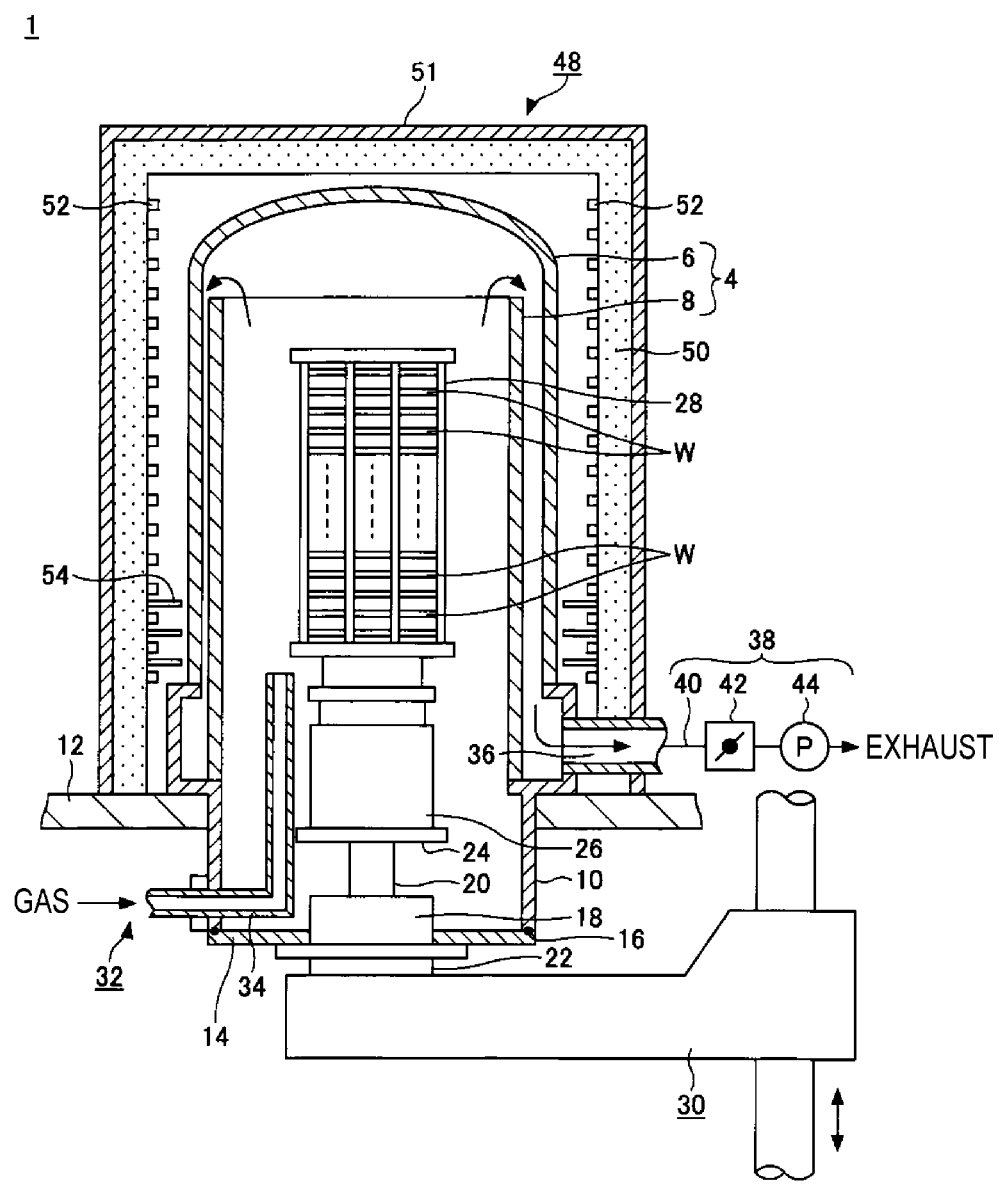
FIG. 1 is a cross-sectional view illustrating an exemplary configuration of a heat treatment apparatus.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. In all of the accompanying drawings, the same or corresponding members or parts are denoted by the same or corresponding reference numerals, and redundant explanations are omitted.

(Heat Treatment Apparatus)

Figure 2:
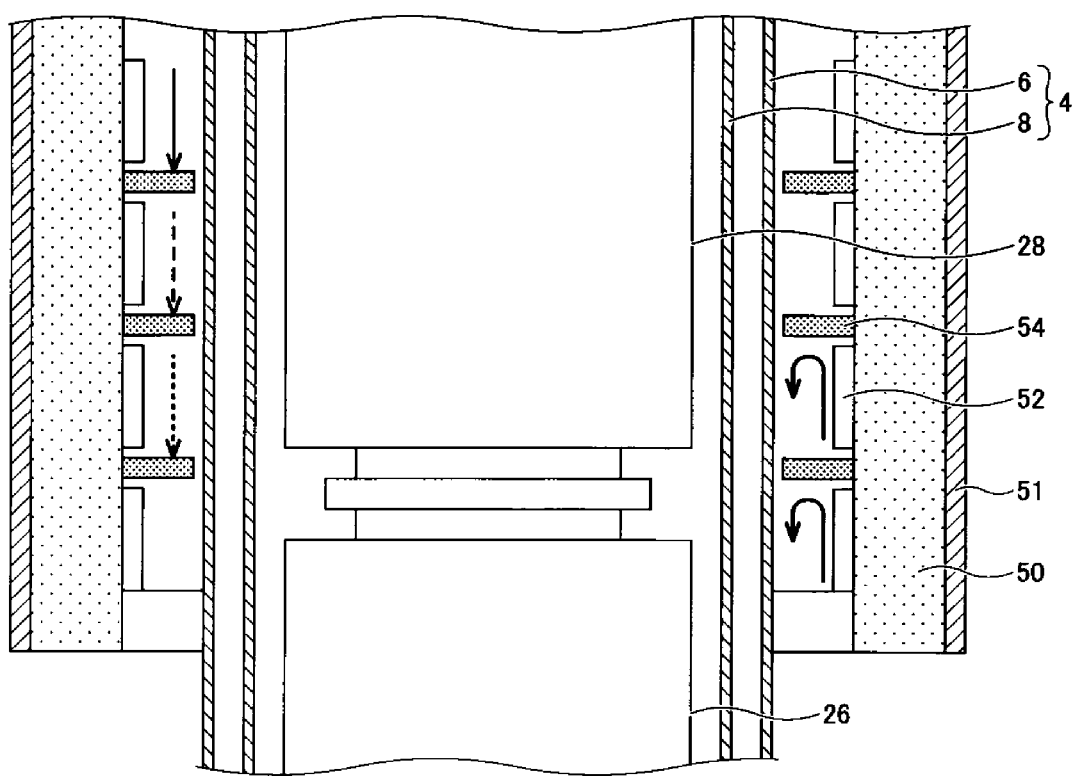
FIG. 2 is a cross-sectional view illustrating an exemplary configuration of a heater device.
Figure 3:
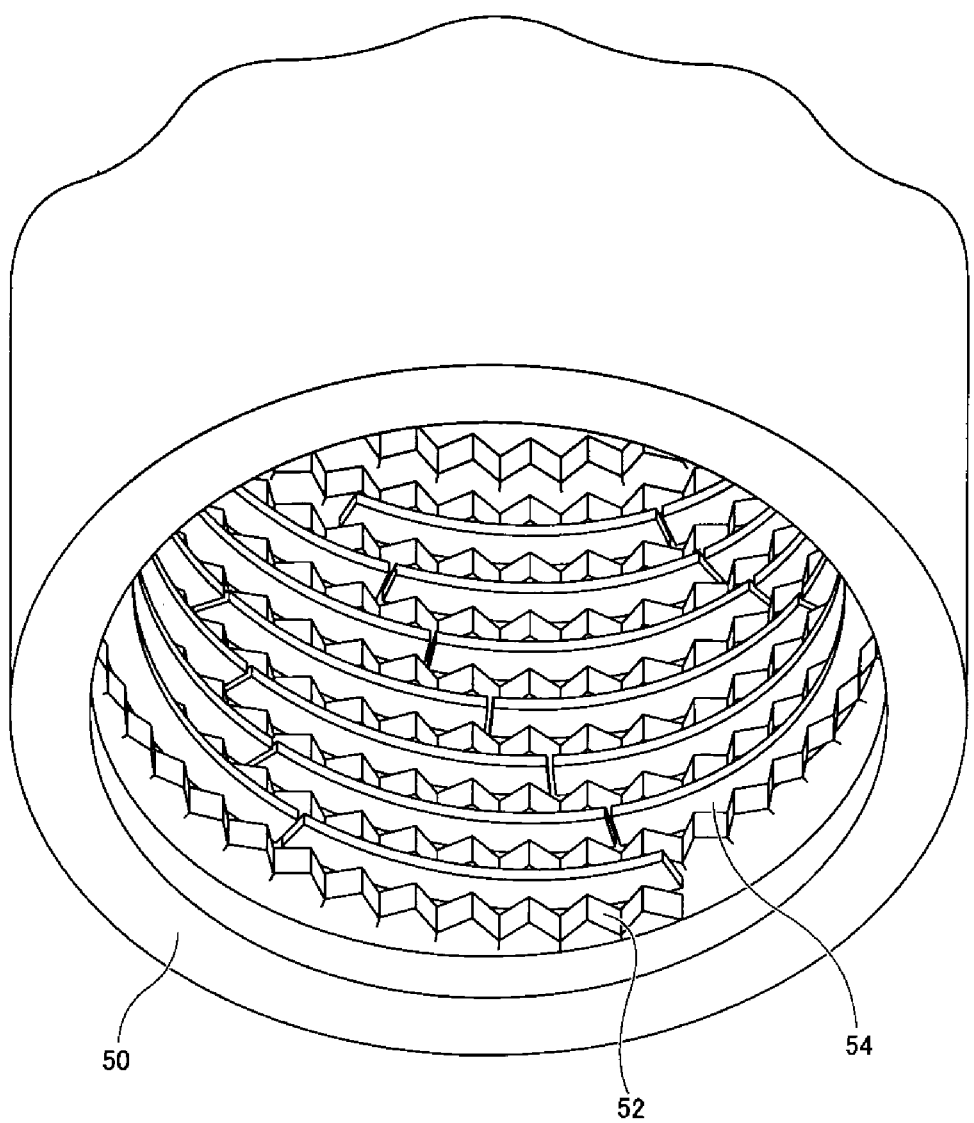
FIG. 3 is a perspective view illustrating the exemplary configuration of a heater device.

Descriptions will be made on a heat treatment apparatus according to an embodiment of the present disclosure. The heat treatment apparatus according to the embodiment of the present disclosure is a batch type vertical heat treatment apparatus that performs a heat treatment on a plurality of substrates at once. FIG. 1 is a cross-sectional view illustrating an exemplary configuration of a heat treatment apparatus. FIG. 2 is a cross-sectional view illustrating an exemplary configuration of a heater device. FIG. 3 is a perspective view illustrating the exemplary configuration of the heater device, when viewed the heater device of FIG. 1 from the bottom side.

As illustrated in FIG. 1, a heat treatment apparatus 1 includes a vertically extended processing container 4 of which the longitudinal direction is a vertical direction. The processing container 4 is configured as a double tube structure that has an outer tube 6 that has a ceiling and a cylindrical-shaped inner tube 8 that is concentrically arranged inside the outer tube 6.

The outer tube 6 and the inner tube 8 are formed of a heat-resistant material such as quartz. Lower end portions of the outer tube 6 and the inner tube 8 are held by a manifold 10 formed of, for example, stainless steel. The manifold 10 is fixed to a base plate 12. The entire processing container 4 may be formed of, for example, quartz, without providing the manifold 10.

A disc-shaped cap portion 14 formed of, for example, stainless steel is attached to an opening at a lower end portion of the manifold 10 so as to be air-tightly sealable via a seal member 16 such as an O-ring. A rotating shaft 20 is inserted through a substantially central portion of the cap portion 14, and is rotatable in an air-tight state by, for example, a magnetic fluid seal 18. A lower end of the rotating shaft 20 is connected to a rotating mechanism 22, and an upper end thereof is fixed to a table 24 formed of, for example, stainless steel.

A heat reserving tube 26 made of, for example, quartz is provided on the table 24. A wafer boat 28 made of, for example, quartz is placed on the heat reserving tube 26.

In the wafer boat 28, a plurality of (e.g., 50 to 150) semiconductor wafers (hereinafter, referred to as "wafers W" are accommodated at predetermined intervals (e.g., at pitches of about 10 mm). The wafer boat 28, the heat reserving tube 26, the table 24, and the cap portion 14 are integrally loaded into/unloaded from the processing container 4 by a lifting mechanism 30 which is, for example, a boat elevator.

A gas introducing unit 32 for introducing a processing gas into the processing container 4 is provided at a lower portion of the manifold 10. The gas introducing unit 32 includes a gas nozzle 34 provided to air-tightly penetrate the manifold 10. Although FIG. 1 illustrates a case where one gas introducing unit 32 is provided, a plurality of gas introducing units 32 may be provided according to, for example, the number of gas types to be used. A flow rate of the gas introduced from the gas nozzle 34 to the processing container 4 is controlled by a flow rate control mechanism (not illustrated).

A gas outlet 36 is provided in the upper portion of the manifold 10. An exhaust system 38 is connected to the gas outlet 36. The exhaust system 38 includes an exhaust passage 40 connected to the gas outlet 36, and a pressure adjusting valve 42 and a vacuum pump 44 which are interposed in the middle of the exhaust passage 40. By the exhaust system 38, it is possible to exhaust the processing container 4 while adjusting the pressure therein.

At the outer circumferential side of the processing container 4, a heater device 48 configured to heat wafers W is provided to surround the processing container 4. The heater device 48 includes a first insulating member 50, a protective cover 51, a heat generating element 52, and a second insulating member 54.

The first insulating member 50 has a ceiling surface, and is formed in a cylindrical shape that is opened at its lower end portion. The lower end portion of the first insulating member 50 is supported by the base plate 12. The first insulating member 50 is formed of, for example, a mixture of alumina and amorphous silica that has a low thermal conductivity, and is relatively soft. The first insulating member 50 is arranged such that the inner circumference thereof is spaced apart from the outer surface of the processing container 4 by a predetermined distance.

The protective cover 51 is attached so as to cover the entire surface of the outer circumference of the first insulating member 50. The protective cover 51 is formed of, for example, stainless steel.

The heat generating element 52 is arranged to be spirally wound on the inner circumferential side of the first insulating member 50. The heat generating element 52 is connected to a power supply, generates heat when power is supplied, and heats the wafers W held by the wafer boat 28. For example, as illustrated in FIG. 3, the heat generating element 52 is a heater wire that is formed of a thin-plate member that has a rectangular-shaped cross-section arranged to be spirally wound with a predetermined winding diameter and a predetermined arrangement pitch on the inner circumferential side of the first insulating member 50. The thin-plate member is processed into, for example, a corrugated shape, and is fixed to the first insulating member 50 by a pin. Meanwhile, the heat generating element 52 may be a heater wire formed of, for example, a wire member that has a circular-shaped cross-section. Further, the heat generating element 52 may have a spiral groove portion formed on the inner circumferential side of the first insulating member 50, and be fitted into the groove portion to be fixed, instead of fixing with the pin. Further, the heat generating element 52 may be divided into a plurality of zones in the vertical direction. In a case where the heat generating element 52 is divided into a plurality of zones in the vertical direction, it is possible to adjust the temperature of the processing container 4 in the vertical direction by controlling the amount of heat generated by the heat generating element 52 for each zone.

The second insulating member 54 is provided along the circumferential direction between the heat generating elements 52 adjacent in the vertical direction. The second insulating member 54 is provided, for example, in the lower portion (opening side) of the first insulating member 50. The second insulating member 54 extends from the inner wall of the first insulating member 50 toward the processing container 4 side, and is formed in an eave shape. For example, the second insulating member protrudes to be closer to the processing container 4 side than the heat generating element 52. The second insulating member 54 forms a slight gap with the outer wall of the processing container 4. Further, for example, as illustrated in FIG. 3, the second insulating member 54 is formed to be divided into a plurality of portions, and each divided portion of the second insulating member 54 has an arc shape when viewed from the longitudinal direction of the processing container 4. Meanwhile, the second insulating member 54 may be formed integrally without being divided into a plurality of portions. Further, for example, as illustrated in FIG. 2, the second insulating member 54 has a rectangular-shaped cross-section in the longitudinal direction of the processing container 4. The constituent material of the second insulating member 54 may have insulation and heat resistance, and may be, for example, a ceramic material. As the ceramic material, for example, alumina $Al_2O_3$ or aluminum nitride AlN may be used.

According to the heat treatment apparatus according to the embodiment of the present disclosure, since the second insulating member 54 is provided along the circumferential direction between the adjacent heat generating elements 52 in the vertical direction, it is possible to suppress natural convection due to the temperature difference in the vertical direction caused by the heat generation of the heat generating element 52. Therefore, the temperature stability in the processing container is improved. Further, since it is possible to suppress the heat radiation to the opening of the first insulating member 50, the temperature drop of the lower portion of the first insulating member 50 is reduced, and then, the power supplied to the heat generating element 52 to maintain the inside of the processing container 4 at a predetermined temperature may be reduced.

In particular, in a case where the heat generating element 52 is divided into a plurality of portions in the vertical direction and the power supplied to each heat generating element 52 is controlled independently, when the heat radiation to the opening of the first insulating member 50 is large, the temperature uniformity in the vertical direction is improved by increasing the power supplied to the heat generating element 52 that is close to the opening. However, when the power supplied to the heat generating element 52 close to the opening is increased, the temperature in the vicinity of the heat generating element 52 is raised than the temperature in the vicinity of the heat generating element 52 above the heat generating element 52, and thus, there is a problem in that the rising air flow (natural convection) is generated in the space between the processing container 4 and the first insulating member 50. In the heat treatment apparatus according to the embodiment of the present disclosure, since the second insulating member 54 is provided along the circumferential direction between the adjacent heat generating elements 52 in the vertical direction, it is possible to suppress natural convection caused in the space between the processing container 4 and the first insulating member 50.

Further, according to the heat treatment apparatus according to the embodiment of the present disclosure, the second insulating member 54 protrudes to be closer to the processing container 4 side than the heat generating element 52. As a result, the suppression effect of the natural convection and the suppression effect of the heat radiation may be particularly enhanced.

Further, according to the heat treatment apparatus according to the embodiment of the present disclosure, the second insulating member 54 is formed to be divided into a plurality of portions. As a result, the second insulating member 54 may be easily attached after arranging the heat generating element 52 on the inner circumferential side of the first insulating member 50, and thus, it is possible to reduce the manufacturing cost. Further, in addition to the new heater device, it is possible to easily attach the second insulating member 54 to the heater device that is provided in advance.

Figure 4:
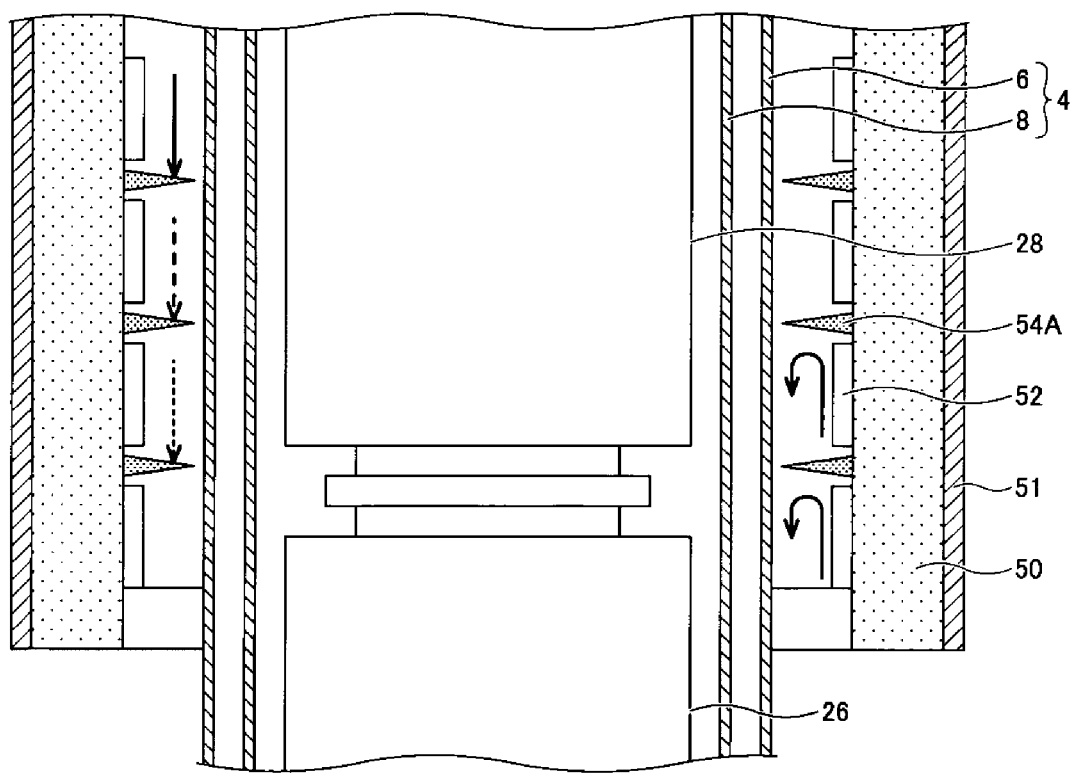
FIG. 4 is a cross-sectional view illustrating another exemplary configuration of a heater device.
Figure 5:
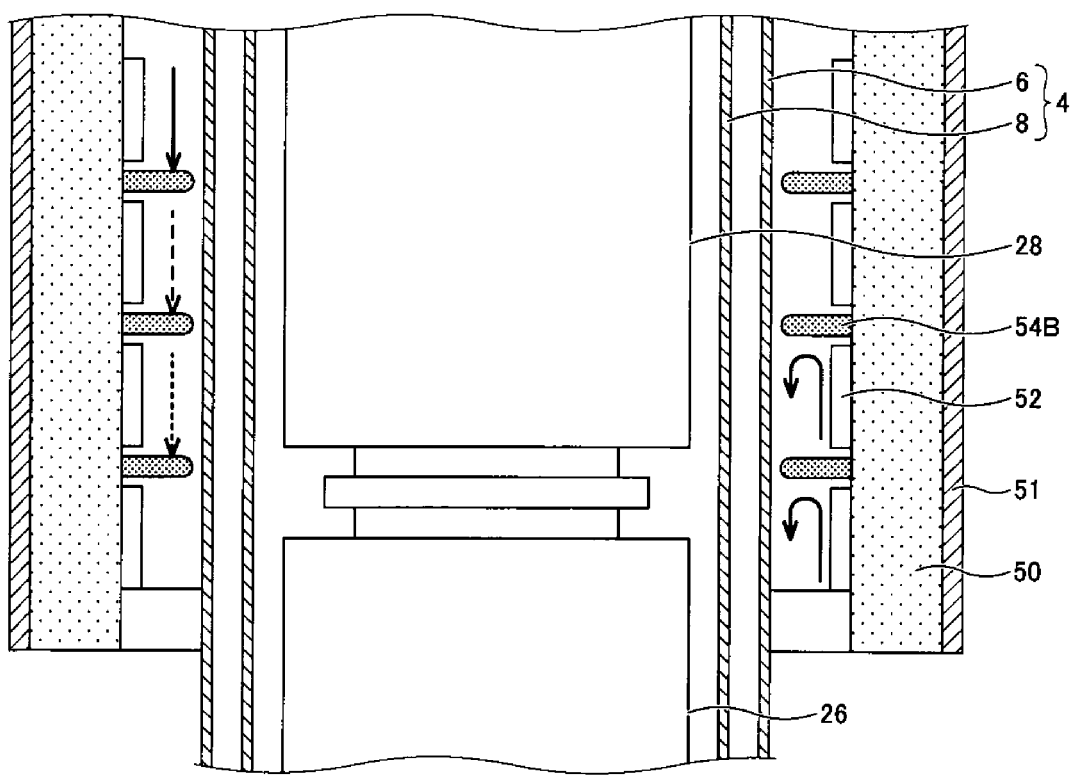
FIG. 5 is a cross-sectional view illustrating yet another exemplary configuration of a heater device.

In the above embodiment, descriptions have been made on the case where the heater device 48 has the second insulating member 54 that has a rectangular-shaped cross-section in the longitudinal direction of the processing container 4. However, the present disclosure is not limited thereto. For example, as illustrated in FIG. 4, the heater device 48 may have a second insulating member 54A that has a triangular cross section in the longitudinal direction of the processing container 4 whose acute angle is on the side that faces the processing container 4. As the shape of the cross-section is a triangle, it is possible to reduce the amount of the member to be used, and thus, the manufacturing cost is reduced. Further, for example, as illustrated in FIG. 5, the heater device 48 may have a second insulating member 54B that has a rectangular cross-section in the longitudinal direction of the processing container 4, and a corner of a side that faces the processing container 4 is rounded. Since the corner of the side is rounded, it is possible to suppress the breakage of the processing container 4 even when being contacted to the outer surface of the processing container 4. FIG. 4 is a cross-sectional view illustrating another exemplary configuration of the heater device, and FIG. 5 is a cross-sectional view illustrating yet another exemplary configuration of the heater device.

EXAMPLE

Descriptions will be made on an example that is carried out to confirm the effect of the heat treatment apparatus 1 according to the embodiment of the present disclosure.

In the example, the power supplied to the heat generating element 52 was controlled such that the wafer temperature in each zone became 500° C., by the heat treatment apparatus 1 that has the heat generating element 52 divided into seven zones that are able to be independently controlled, and the second insulating member 54 provided to be corresponded to the heat generating element 52 in a zone in the lowermost portion. Further, for comparison, the power supplied to the heat generating element 52 was controlled such that the wafer temperature in each zone became 500° C., by a heat treatment apparatus that has the heat generating element 52 divided into seven zones that are able to be independently controlled, does not have the second insulating member 54. Then, for each heat treatment apparatus, the power supplied to the heat generating element 52 was measured when the wafer temperature in each zone was stabled at 500° C.

In the example, the power supplied to the heat generating element 52 was 1.24%, 0.71%, 0.70%, 0.82%, 1.11%, 1.70%, and 6.63% of the rated power, in order from the top to the bottom. Meanwhile, in the comparative example, the power supplied to the heat generating element 52 was 1.26%, 0.68%, 0.70%, 0.78%, 1.02%, 1.65%, and 7.68% of the rated power, in order from the top to the bottom.

According to the above results, it may be found out that the power supplied to the heat generating element 52 in the zone in the lowermost portion is decreased by approximately 13 points (7.68% to 6.63% of the rated power), by providing the second insulating member 54 at a position corresponding to the heat generating element 52 in the zone in the lowermost portion.

In the above embodiment, descriptions have been made on the case where the heat generating element 52 is arranged to be wound spirally on the inner circumferential side of the first insulating member 50. However, the present disclosure is not limited thereto. The heat generating element 52 may be provided along the circumferential direction on the inner circumferential side of the first insulating member 50. For example, the heat generating element 52 may be arranged over the entire circumference on the inner circumferential side of the first insulating member 50 while being bent vertically in a bellows shape. In this case, the second insulating member 54 is arranged on at least one side of either above the bent portion on the upper side of the heat generating element 52 or below the bent portion on the lower side of the heat generating element 52.

In the above embodiment, descriptions have been made on the case as an example where the processing container has the double tube structure that has the inner tube and the outer tube. However, the present disclosure is not limited thereto. For example, the processing container may have a single tube structure.

In the above embodiment, descriptions have been made on the case as an example where the processing gas is supplied to the inside of the processing container from the position at the lower end portion of the processing container. However, the present disclosure is not limited thereto. For example, a configuration may be used in which a gas nozzle is arranged along the longitudinal direction of the wafer boat so as to supply the processing gas by the side flow method.

In the above embodiment, descriptions have been made on the case as an example where the substrate to be processed by the heat treatment apparatus is the semiconductor wafer. However, the present disclosure is not limited thereto. For example, the substrate may be a large substrate for a flat panel display (FPD), an EL element, or a substrate for a solar cell.

According to the present disclosure, it is possible to improve the temperature stability in the processing container.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment apparatus comprising:
   a processing container extended in a vertical direction; and
   a heater provided to surround the processing container, wherein the heater includes:
   a first insulator of a cylindrical shape that has a ceiling surface and an opening at a lower end,
   a heat generator provided along a circumferential direction on an inner circumferential side of the first insulator, and
   a second insulator extending from the inner circumferential side of the first insulator toward the processing container and arranged along the circumferential direction of the first insulator at a position adjacent to the heat generator, and
   wherein a first gap is formed between the processing container and the second insulator in a plan view when viewed from the lower end of the first insulator.

2. The heat treatment apparatus according to claim 1, wherein the heat generator is provided to be wound spirally, and the second insulator is arranged between adjacent heat generators.

3. The heat treatment apparatus according to claim 2, wherein the second insulator is provided on a side of the opening of the first insulator.

4. The heat treatment apparatus according to claim 3, wherein the second insulator protrudes to be closer to the processing container than the heat generator.

5. The heat treatment apparatus according to claim 4, wherein the second insulator is divided into a plurality of portions.

6. The heat treatment apparatus according to claim 5, wherein each divided portion of the second insulator has an arc shape when viewed from a longitudinal direction of the processing container.

7. The heat treatment apparatus according to claim 6, wherein the second insulator has a quadrangular-shaped cross-section in the longitudinal direction of the processing container.

8. The heat treatment apparatus according to claim 7, wherein the second insulator has a rectangular-shaped cross-section in the longitudinal direction of the processing container, and a rounded corner on a side of the processing container.

9. The heat treatment apparatus according to claim 8, wherein the second insulator has a triangular-shaped cross-section in the longitudinal direction of the processing container.

10. The heat treatment apparatus according to claim 9, wherein the heat generator is divided into a plurality of portions in the longitudinal direction of the processing container.

11. The heat treatment apparatus according to claim 1, wherein the second insulator is provided on a side of the opening of the first insulator.

12. The heat treatment apparatus according to claim 1, wherein the second insulator protrudes to be closer to the processing container than the heat generator.

13. The heat treatment apparatus according to claim 1, wherein the second insulator is divided into a plurality of portions.

14. The heat treatment apparatus according to claim 1, wherein each divided portion of the second insulator has an arc shape when viewed from a longitudinal direction of the processing container.

15. The heat treatment apparatus according to claim 1, wherein the second insulator has a quadrangular-shaped cross-section in the longitudinal direction of the processing container.

16. The heat treatment apparatus according to claim 1, wherein the second insulator has a rectangular-shaped cross-section in the longitudinal direction of the processing container, and a rounded corner on a side of the processing container.

17. The heat treatment apparatus according to claim 1, wherein the second insulator has a triangular-shaped cross-section in the longitudinal direction of the processing container.

18. The heat treatment apparatus according to claim 1, wherein the heat generator is divided into a plurality of portions in the longitudinal direction of the processing container.

19. The heat treatment apparatus according to claim 1, wherein the second insulator is divided in the circumferential direction into a plurality of divided portions to form second gaps therebetween, and
at least two of the second gaps adjacent to each other in the vertical direction do not overlap each other in the vertical direction.

20. The heat treatment apparatus according to claim 19, wherein a length of a divided portion of the second insulator in the circumferential direction is greater than a length of the second gap in the circumferential direction.

* * * * *